United States Patent [19]

Williams et al.

[11] Patent Number: 5,132,235
[45] Date of Patent: Jul. 21, 1992

[54] METHOD FOR FABRICATING A HIGH VOLTAGE MOS TRANSISTOR

[75] Inventors: Richard K. Williams, Cupertino; Robert W. Busse, Mountain View; Richard A. Blanchard, Los Altos, all of Calif.

[73] Assignee: Siliconix Incorporated, Santa Clara, Calif.

[21] Appl. No.: 678,578

[22] Filed: Mar. 29, 1991

Related U.S. Application Data

[62] Division of Ser. No. 83,560, Aug. 7, 1987, abandoned.

[51] Int. Cl.$^5$ .......................................... H01L 21/265
[52] U.S. Cl. .......................................... 437/31; 437/40; 437/77; 437/26; 437/151; 148/DIG. 85
[58] Field of Search .................. 437/76, 77, 26, 150, 437/151, 40, 31; 148/DIG. 85

[56] References Cited

U.S. PATENT DOCUMENTS

| | | | |
|---|---|---|---|
| 3,547,716 | 12/1970 | Witt et al. | 437/77 |
| 3,702,428 | 11/1972 | Schmitz et al. | 437/150 |
| 3,723,199 | 3/1973 | Vera | 437/77 |
| 3,802,968 | 4/1974 | Ghosh et al. | 437/77 |
| 3,865,648 | 2/1975 | Castrucci et al. | 437/77 |
| 3,929,526 | 12/1975 | Nuttall et al. | 357/48 |
| 3,993,512 | 11/1976 | Encinas | 357/44 |
| 4,032,372 | 6/1977 | Vora | 437/150 |
| 4,311,532 | 1/1982 | Taylor | 437/26 |
| 4,404,048 | 9/1983 | Vogelzang | 437/26 |
| 4,529,456 | 7/1985 | Anzai et al. | 437/150 |

FOREIGN PATENT DOCUMENTS

0003806  1/1980  Japan .................................. 437/77

Primary Examiner—Brian E. Hearn
Assistant Examiner—Tuan Nguyen
Attorney, Agent, or Firm—Skjerven, Morrill, MacPherson, Franklin & Friel

[57] ABSTRACT

A method is disclosed which produces a high voltage MOS transistor with a deep retrograde N-well region, which includes a buried layer, said deep retrograde well region acting to increase the breakdown voltage of the MOS transistor and reduce the current gain of the inherent parasitic bipolar transistor. To achieve a high degree of control over the impurity concentration of the buried layer without affecting the impurity concentration in the N-well region, two dopants species are diffused or implanted in the N+ buried layer: one, a slow diffusing dopant, such as antimony or arsenic, and the other, a more rapidly diffusing dopant, such as phosphorus. A P− type epitaxial layer is grown over the buried layer and an N-well is formed in the epitaxial layer over the buried layer. Using this method, the high concentration of slow diffusing N type antimony or arsenic dopant in the buried layer will not out-diffuse into the N-well region and adversely affect the breakdown voltage between the source or drain and the N-well. The out-diffusing of the phosphorus into the epitaxial layer, however, will merge with the phosphorus diffusion from the top to form a uniform N type concentration in the N-well.

6 Claims, 3 Drawing Sheets

METHOD FOR FABRICATING A HIGH VOLTAGE MOS TRANSISTOR

This application is a division of application Ser. No. 07/083,560, filed Aug. 7, 1987 now abandoned.

BACKGROUND OF THE INVENTION

1. Field of the Invention

This invention relates to MOS devices and in particular to a method for reducing the current gain of parasitic bipolar junction transistors within the MOS structure.

2. Description of Prior Art

FIG. 1 shows a typical low voltage N-well MOS transistor 5 which can be part of a CMOS structure. P substrate 10 has diffused into it N-well region 15 about 3-10 microns deep. P+ source region 20, P+ drain region 25, and N-well region contact 27, are then diffused into N-well region 15. Control gate 30 is formed over and insulated from channel region 35, channel region 35 being the region between source region 20 and drain region 25. Normal operating voltages and connections are as follows: P substrate 10 is grounded or at a negative voltage; N-well region 15 is at a positive voltage $V_{ss}$ with respect to P substrate 10 so as to reverse bias N-well region 15 and P substrate 10; P+ source 20 is shorted to N-well region 15; P+ drain 25 is connected to load 38; and, control gate 30 is connected to input voltage $V_{in}$.

The structure of FIG. 1 is susceptible to over-current damage if the parasitic PNP transistor, formed by P+ drain 25, N-well 15, and P substrate 10, is biased into its active mode and conducts a high current between P+ drain 25 and P substrate 10. One way in which this parasitic PNP transistor may be turned on is that if load 38, connected to P+ drain 25, is inductive, a high voltage may result from the rapid di/dt turn-off of transistor 5. This high voltage generated by the load forward biases the P-N junction formed between P+ drain 25 and N-well 15. Since the junction between N-well 15 and P substrate 10 is reverse biased, the parasitic PNP transistor is biased into its active mode. Noise from the load into the drain can also cause parasitic transistor turn-on, even when the MOS transistor is on, if the noise voltage is greater than 0.7v above the N-well voltage.

One way to reduce the current through a parasitic PNP or NPN transistor is to reduce its current gain by forming a highly doped buried region of the same conductivity type as the well region below and contiguous with the well region. This buried layer creates a built-in electric field which is in a direction that opposes the transit of minority carriers across the base, or well, and also widens the base region. This increased base width, along with an increased Gummel number (i.e., total charge in the base region), results in almost total recombination of the injected minority carriers within the base region.

In low voltage CMOS structures parasitic bipolar junction transistors are formed, as shown in FIG. 2, which can cause latch-up Latch-up occurs in a low voltage CMOS structure due to a four layer NPNP or PNPN path.

Turn-on of parasitic bipolar junction transistors in CMOS structures can be largely eliminated by forming a buried region below the well, thus forming a retrograde well, in order to reduce the loop current gain of the parasitic transistor pair to below unity. This buried region has been experimentally demonstrated and shown to reduce gain by as much as two orders of magnitude. This method to reduce parasitic transistor current gain in low voltage CMOS structures is discussed in the following references: "Latch-Up Control in CMOS Integrated Circuits", by A. Ochoa et al., IEEE Trans. Nucl Sci., Vol. NS-26., No Dec. 6. 1979; "An Analysis of Latch-Up Prevention in CMOS ICs Using An Epitaxial Buried Layer Process", by D. Estreich et al., International Electron Device Meeting, Washington, D.C. 1978; and the book, "Latch-Up in CMOS Technology", by R. Troutman, Kluwer Academic Publishers, Boston, 1986. These three references are herein incorporated by reference.

A typical doping profile for an NMOS transistor with a retrograde P-well is shown in FIG. 3. In the references mentioned above, the same type implant (e.g., boron) was used to form the P+ buried region and P-well As an example, Estreich et al. describe a method for forming a low voltage CMOS structure by, inter alia, implanting boron into an N substrate to form a P+ buried layer, forming an N-epitaxial layer over the buried layer, and then implanting boron into the epitaxial layer to form the P-well. The P+ buried layer and the P-well then diffuse together in what is called an up-down method to form the retrograde well.

In prior art high voltage MOS transistors, wells formed using the up-down method which incorporate a buried layer are not used due to the likelihood that the high concentration of impurities in the buried layer will diffuse into the well region and reduce the breakdown voltage of the device. Breakdown voltage would be reduced since the depletion region between a P+ drain and a highly doped N-well region spreads very little with an increase in reverse bias voltage, consequently, the electric field between the P+ drain and N-well increases, eventually causing breakdown. Deeper diffused N-wells (e.g., greater than 10 microns) are not practical due to the long drive-in times required Prior art high voltage MOS transistors typically use more expensive deep "tubs", which are isolated portions of an epitaxial layer of a conductivity type opposite that of the substrate, in conjunction with a highly doped buried layer of the same conductivity type as the epitaxial layer, as shown in FIG. 4, to reduce the current gain of the parasitic bipolar transistor.

FIG. 4 shows a typical high voltage MOS transistor 40 with N+ layer 42 formed to reduce the current gain of the parasitic PNP transistor formed by P+ drain region 49, N- epitaxial layer 45, and P substrate 41. In FIG. 4, transistor 40 is formed starting with P substrate 41 and diffusing an N type dopant, such as arsenic, into substrate 41 to subsequently form N+ buried layer 42 A P type dopant, such as boron, is then implanted to subsequently form isolation region 44 N- epitaxial layer 45 is then grown on P substrate 41 and dopants used to form buried layer 42 and isolation region 44 diffuse up into epitaxial layer 45. P type dopants are then introduced from above to form isolation region 46 which merges with isolation region 44 to isolate transistor 40 from other devices within epitaxial layer 45. P type dopants are then introduced to form P+ source region 48, P+ drain region 49, and P- drift region 50 contiguous with drain region 49. N type dopants are introduced to form N+ contact region 51. The P+ isolation regions in FIG. 4 are formed in a lengthy process using an up-down method, where diffusion from below and above an epitaxial layer merge together to form one continuous diffusion region.

What is needed in the art is a method to form a deep well and buried layer in an epitaxial layer and semiconductor substrate which would have a high breakdown voltage and reduce parasitic transistor current gain. This well would obviate the need to form isolation regions of a conductivity type opposite that of the epitaxial layer to isolate the MOS transistor from other devices and would save processing time.

SUMMARY

An N-well and N+ buried layer are formed in a high voltage MOS transistor to reduce the current gain of the parasitic bipolar junction transistor formed by the P+ source or drain region, the N-well region, and the P substrate, while maintaining a high breakdown voltage between the N-well and the P substrate and between the P+ drain region and the N-well To achieve a high degree of control over the impurity concentration of the buried layer without affecting the impurity concentration in the N-well region, two dopant species are diffused or implanted in the buried layer one, a slow diffusing dopant, such as antimony or arsenic, and the other, a more rapidly diffusing dopant, such as phosphorus. A P epitaxial layer is grown over the buried layer and an N-well is formed in the epitaxial layer over the buried layer. The more rapidly diffusing dopant is also used in the preferred embodiment for the N-well doping. Using this method, the high concentration of slow diffusing N type antimony or arsenic dopant in the buried layer will not out-diffuse into the N-well region and adversely affect the breakdown voltage between the P+ drain and the N-well The out-diffusing of the phosphorus into the epitaxial layer will, instead, merge with the phosphorus diffusion from the top to form an essentially uniform N type concentration in the N-well. The N-well is now sufficiently deep to prevent breakdown at typical high voltage operating levels. Using a slow diffusing dopant in the buried layer also enables better control over the impurity concentration in the buried layer and, thus enables better control over the current gain of the vertical bipolar PNP transistor.

BRIEF DESCRIPTION OF THE DRAWINGS

FIG. 5b is a doping profile for the preferred embodiment shown in FIG. 5a.

DETAILED DESCRIPTION OF THE PREFERRED EMBODIMENT

Figure 1:
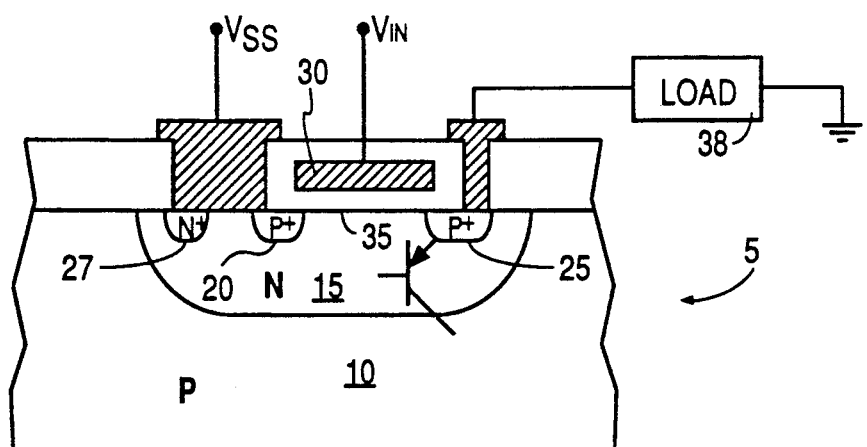
FIG. 1 is a cross-sectional diagram of a prior art low voltage N-well MOS transistor.
Figure 2:
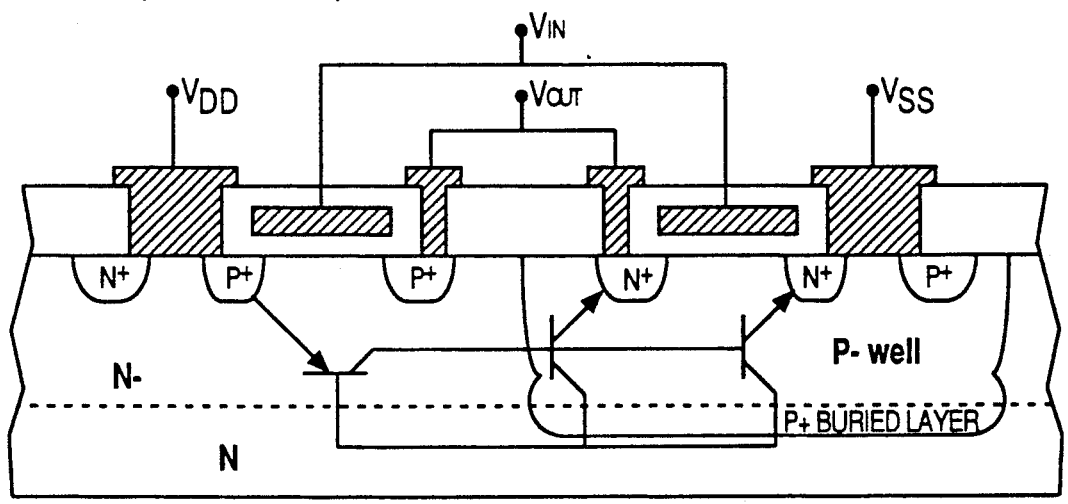
FIG. 2 is a cross-sectional diagram of a typical CMOS structure showing the inherent parasitic bipolar junction transistors formed within.
Figure 3:
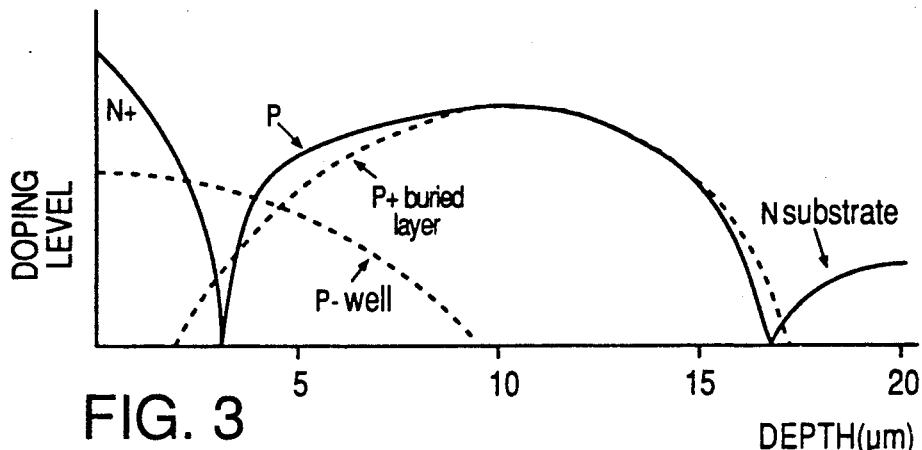
FIG. 3 is a typical doping profile for an NMOS transistor using a P-well and P+ buried layer.
Figure 4:
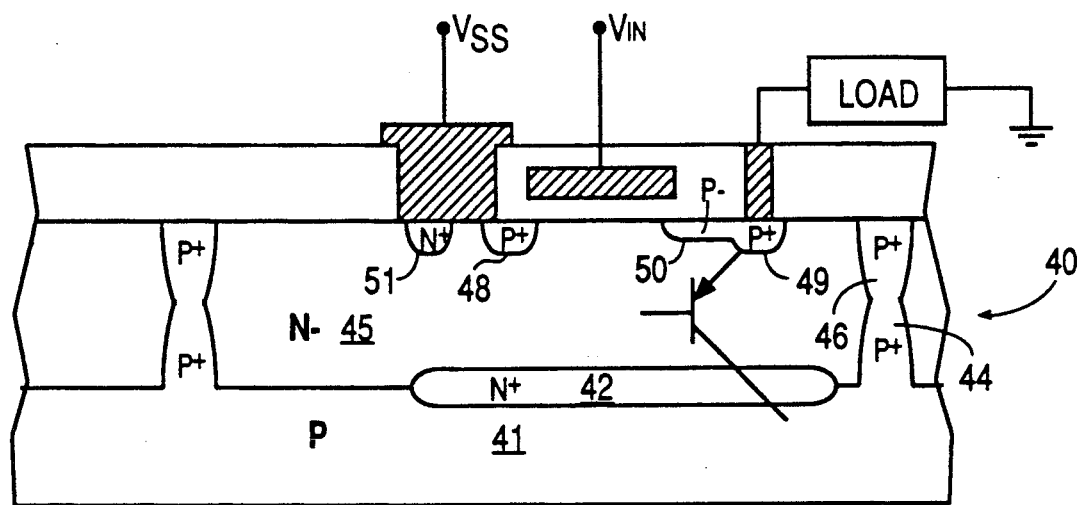
FIG. 4 is a cross-sectional diagram of a prior art high voltage junction isolation MOS transistor.
Figure 5A:
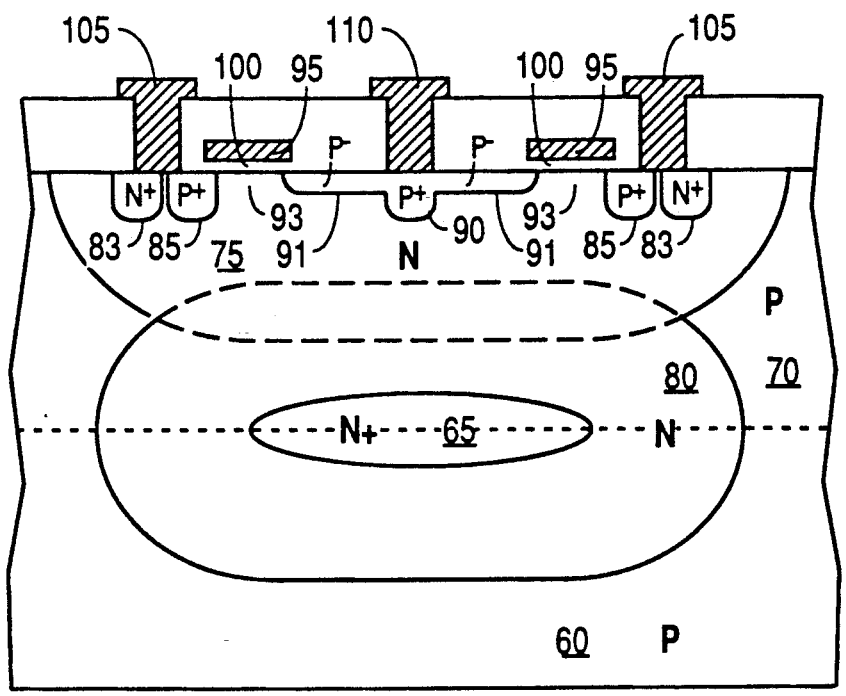
FIG. 5a is a cross-sectional diagram of the preferred embodiment of an MOS transistor formed using the present inventive method.

Shown in FIG. 5a is the preferred embodiment of the invention. P substrate 60, having a resistivity of about 40–50 $\Omega$-cm, is masked and has diffused in it antimony and phosphorus to form N+ buried layer 65 with a dopant concentration after drive-in of approximately $10^{15}$ atoms/cm$^3$ antimony and $10^{12}$ atoms/cm$^3$ phosphorus Arsenic may be used instead of antimony P epitaxial layer 70, about 15 microns thick, is then formed on the surface of P substrate 60, and phosphorus, a rapidly diffusing N type dopant, is diffused into the surface of epitaxial layer 70 and driven-in to form N-well 75, approximately 10 microns deep and having a sheet resistance of about 1K$\Omega$/square. After drive-in, the slow diffusing antimony in buried layer 65 diffuses very little into substrate 60 and into epitaxial layer 70, while the more rapidly diffusing dopant in the buried layer, phosphorus, diffuses a much greater distance into both substrate 60 and epitaxial layer 70 to form lower N-well 80, about 15 microns thick. The rapidly diffusing phosphorus, diffused into the surface of epitaxial layer 70, after drive-in, has diffused down to where the dopant has merged with the phosphorus dopant from the buried region in what is called an up-down diffusion. N+ contact region 83 is formed, providing an electrical contact to the upper and lower N- wells. P+ source region 85 and P+ drain region 90, both about 2 microns deep, are then formed in N-well 75, as is lightly doped drain extension 91. Drain extension 91 increases the breakdown voltage by further separating P+ drain region 90 from channel region 93, channel region 93 being the region between source region 85 and drain extension 91. Gate oxide layer 100 is next formed over channel region 93 between source 85 and drain extension 91, and polycrystalline silicon (poly-Si) control gate 95 is formed over gate oxide layer 100. Metal contacts 105, 110 are then formed to provide electrical contact to P+ source region 85, N+ contact region 83, and P+ drain region 90. Contact to gate 95 is not shown.

Figure 5B:
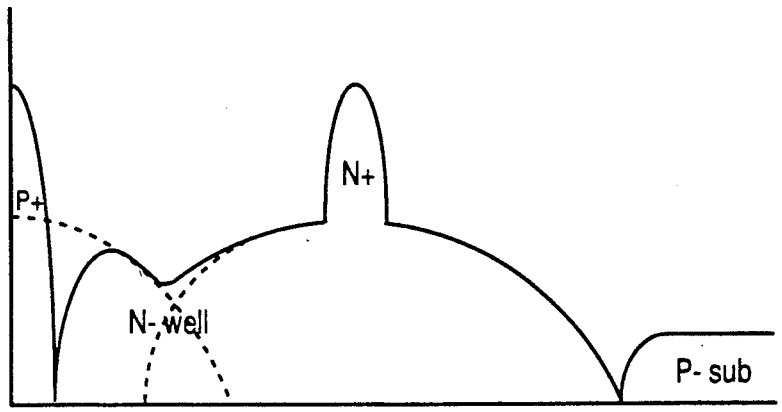

A nominal dopant profile for the structure of FIG. 5a is shown in FIG. 5b.

Figure 6:
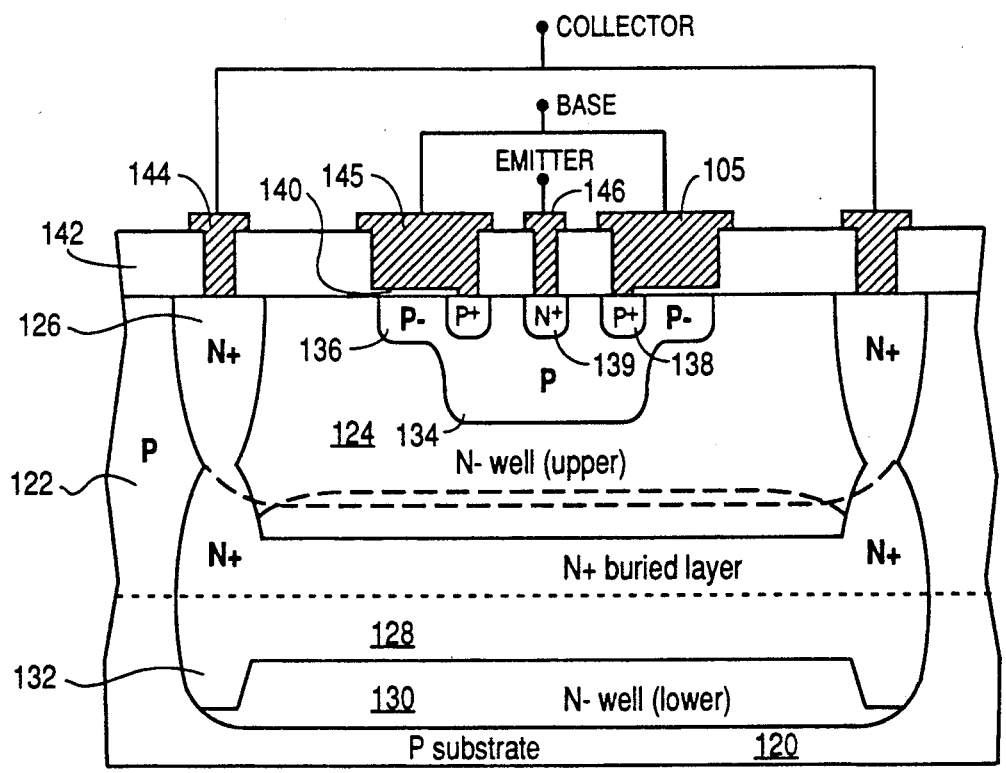
FIG. 6 is a cross-sectional diagram of the preferred embodiment of an NPN transistor formed using the present inventive method.

The above described structure provides an MOS transistor with a breakdown voltage of greater than 130 volts, given a drift length (distance from gate poly-Si to the P+ drain region) of 12 microns or more, and a parasitic transistor beta of approximately 0.06. Antimony doping concentration in the buried layer of about $5\times10^{15}$ atoms/cm$^3$ will produce a beta of approximately 0.002. Higher breakdown voltages between the P+ drain region and the N-well can be achieved by lighter doping of the N-well and/or a deeper N-well. Also, a second epitaxial layer may be formed over the first epitaxial layer and upper N-well region and a third N-well diffused into the second epitaxial layer. This process, known as an up-down-middle process, produces a deeper N-well and, consequently, increases the breakdown voltage. The current gain of the lateral parasitic transistor, formed by the P+ drain region, N-well, and P epitaxial layer, may be further reduced by using N+ isolation regions to surround the N-well. In another embodiment of the invention an NPN bipolar junction transistor, shown in FIG. 6, is formed with an N+ buried layer. The NPN transistor, as described, exhibits a high breakdown voltage as well as very low collector resistance. Starting with P substrate 120, antimony and phosphorus are diffused into a region of substrate 120 in a predeposition step to subsequently form buried layer 128. If N+ isolation regions are desired, an increased concentration of phosphorus is diffused into a ring surrounding the region. Next, P epitaxial layer 122 is grown on the surface of substrate 120. Phosphorus is then diffused into epitaxial layer 122 from above and driven-in to form upper N-well 124 and upper isolation region 126. The drive-in step also diffuses the slow diffusing antimony and the fast diffusing phosphorus in substrate 120 to form N+ buried layer 128, lower N-well 130, and lower isolation region 132. P type base impurities are diffused into the surface of epitaxial layer 122 to form P base region 134, including P- drift region 136 and P+ contact region 138. Emitter impurities are diffused into base region 134 to form N+ emitter region 139. Upper N+ isolation region 126 provides a contact region and acts as a collector region along with lower N+ isolation region 132 and N+ buried layer 128. A thin layer of oxide 140 is deposited or grown over drift region 136 and a thick layer of oxide 142 is deposited or grown over the remaining epitaxial layer surface. Contact holes are etched, and a metallization step is used to deposit metal contacts 144, 145, 146. Base contact 145, which contacts base region 134, also acts as a field plate over drift region 136. Normal operating conditions for the NPN transistor of FIG. 6 are as follows. Substrate 120 is grounded; emitter region 139 is grounded or at close to ground potential; N+ regions 126, 132, and 128 are at a high potential by applying a high voltage to collector contact 144; and, the emitter/base junction formed by emitter region 139 and base region 134 is forward biased by applying a positive voltage to base contact 145. When the NPN transistor is biased into its active mode, as described above, an increased base voltage provides an increased base current, which is amplified by action of the transistor. This amplified current then flows through the collector region and collector contact 144. Drift region 136 and the field plate act to spread the electric field created between P base region 134 and N+ isolation region 126. Isolation regions 126, 132 are not required for the proper performance of the NPN transistor if upper N-well 124 is large enough. If isolation regions are not used, an N+ contact region within N-well 124 will be required as a collector contact.

The present invention describes a general process, using well-known techniques, which may be used in the formation of high voltage MOS and bipolar transistors to achieve a high breakdown voltage and, in MOS transistors, to achieve a low parasitic bipolar transistor current gain. The present invention allows the use of the buried layer, successfully used in low voltage CMOS transistors, in high voltage devices by using slow and rapid diffusing dopants in the buried layer. No prior art high voltage MOS or bipolar transistor is produced using this method High voltage MOS and bipolar transistors can now be formed without diffusing isolation regions into the epitaxial layer to isolate the transistor from the epitaxial layer and the substrate.

While the invention has been particularly shown and described with reference to the preferred embodiment thereof, it will be understood by those skilled in the art that changes in form and detail may be made therein without departing from the spirit and scope of the invention For example, an NMOS or PNP transistor may be formed using this technology with the buried layer being formed using slow diffusing boron and rapidly diffusing aluminum dopants.

We claim:

1. A method for forming an MOS transistor with reduced parasitic transistor current gain, comprising the steps of:

introducing a first dopant of a first conductivity type into a first region of a substrate of a second conductivity type, said first dopant being a slow diffusing type;

introducing a second dopant of a first conductivity type into said first region, said second dopant being a fast diffusing type;

growing an epitaxial layer of a second conductivity type at least over said first region, said epitaxial layer having an upper surface;

introducing said second dopant of a first conductivity type into said upper surface of said epitaxial layer over said first region to form an upper well region, said dopant from said upper well region diffusing and merging together with said second dopant introduced into said first region of said substrate to form a continuous well region, said first dopant, being of a slow diffusing type, diffusing a relatively small distance into said epitaxial layer and forming a buried layer;

introducing a third dopant of a second conductivity type into second and third regions within said upper well region, said second and third regions forming a source region and drain region, respectively;

forming a gate oxide layer over said upper well region between said source region and said drain region; and forming a control gate over said gate oxide layer.

2. The method of claim 1 wherein both of said steps of introducing a second dopant are further characterized in that said concentration of dopants in said first region of said substrate and said upper well region diffuse so as not to adversely affect the breakdown voltage of the device as compared to the breakdown voltage of the device without said second dopant introduced into said region of said substrate.

3. The method of claim 2 wherein said first dopant is selected from the group consisting of antimony and arsenic and said second dopant is phosphorus.

4. The method of claim 2 further comprising the step of introducing said third dopant of a second conductivity type into a fourth region to form a lightly doped drain extension contiguous with said drain region.

5. The method of claim 2 further comprising the step of introducing a dopant of first conductivity type into a region of said upper well region to form a well contact region.

6. The method of claim 2 wherein said first dopant is boron and said second dopant is aluminum.

* * * * *